United States Patent
Waite et al.

(10) Patent No.: US 9,679,776 B2
(45) Date of Patent: Jun. 13, 2017

(54) MASKING FOR HIGH TEMPERATURE IMPLANTS

(71) Applicant: Varian Semiconductor Equipment Associates, Inc., Gloucester, MA (US)

(72) Inventors: Andrew M. Waite, Beverly, MA (US); Naushad Variam, Marblehead, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/807,377

(22) Filed: Jul. 23, 2015

(65) Prior Publication Data

US 2017/0025277 A1    Jan. 26, 2017

(51) Int. Cl.
*H01L 21/425* (2006.01)
*H01L 21/266* (2006.01)
*H01L 21/02* (2006.01)
*H01L 21/308* (2006.01)
*H01L 21/311* (2006.01)

(52) U.S. Cl.
CPC ........ *H01L 21/266* (2013.01); *H01L 21/0217* (2013.01); *H01L 21/02115* (2013.01); *H01L 21/02164* (2013.01); *H01L 21/02532* (2013.01); *H01L 21/02592* (2013.01); *H01L 21/02595* (2013.01); *H01L 21/3081* (2013.01); *H01L 21/31116* (2013.01)

(58) Field of Classification Search
CPC ............ H01L 21/266; H01L 21/02115; H01L 21/02164; H01L 21/0217; H01L 21/02532; H01L 21/02592; H01L 21/02595; H01L 21/3081; H01L 21/31116
See application file for complete search history.

(56) References Cited

U.S. PATENT DOCUMENTS

| | | | |
|---|---|---|---|
| 7,524,740 B1 * | 4/2009 | Liu | H01L 21/02532 438/479 |
| 9,312,143 B1 * | 4/2016 | Cheng | H01L 21/3081 |
| 2004/0221876 A1 * | 11/2004 | Waleh | B08B 7/00 134/30 |
| 2008/0182370 A1 * | 7/2008 | Peidous | H01L 21/324 438/199 |
| 2009/0035584 A1 * | 2/2009 | Tran | H01L 21/0337 428/446 |

(Continued)

Primary Examiner — Shaun Campbell
(74) Attorney, Agent, or Firm — Nields, Lemack & Frame, LLC

(57) ABSTRACT

A method for the selective implantation of a workpiece is disclosed. In place of conventional photoresist, a two layer structure is used. The first layer, referred to as the protective layer, is applied directly to the workpiece and protects the workpiece from harmful etching processes. Additionally, the protective layer has limited ability to stop ions from impacting the workpiece. The second layer, referred to as the blocking layer, which is formed on a portion of the protective layer, is used to block ions from impacting the underlying workpiece. Advantageously, the blocking layer may be selectively etched without affecting the protective layer. Additionally, the protective layer can be removed without affecting the underlying workpiece. Through the use of this two layer technique, high temperature selective implants may be performed on a variety of different semiconductor devices.

18 Claims, 5 Drawing Sheets

(56) References Cited

U.S. PATENT DOCUMENTS

| | | | |
|---|---|---|---|
| 2014/0061738 A1* | 3/2014 | Wang | H01L 27/14689 |
| | | | 257/292 |
| 2014/0183661 A1* | 7/2014 | Lin | H01L 21/823431 |
| | | | 257/401 |
| 2015/0235864 A1* | 8/2015 | Vogt | H01L 21/31155 |
| | | | 438/694 |

* cited by examiner

MASKING FOR HIGH TEMPERATURE IMPLANTS

Embodiments of the present disclosure relate to a method of selectively processing a workpiece, and more particularly, a method to selectively mask a particular portion of a semiconductor workpiece during a high temperature implant.

BACKGROUND

Many processes are used in the creation of a semiconductor device. For example, one or more of these processes may be an ion implant process, where ions are energetically injected into the workpiece. In certain embodiments, ions are only implanted into certain portions of a workpiece. This process may be referred to as a selective implant or a patterned implant.

In certain embodiments, patterned implants are performed by applying a photoresist to the portions of the workpiece that are not to be implanted. In these embodiments, ions are accelerated toward the workpiece. However, ions that strike the photoresist are blocked from impacting the underlying workpiece.

High temperature implants are becoming more common, as certain semiconductor parameters may be improved through the use of high temperature implants. For example, high temperature implantation of arsenic for finFET extension regions has been demonstrated to improve finFET performance, as compared to room temperature implants.

The use of photoresist for patterned implants is very common, however, it also has drawbacks. One such drawback is the temperature limits of the photoresist. Specifically, at high temperatures, such as above 150° C., the photoresist is ineffective at blocking ions and also may not retain its structure. Therefore, traditional photoresist is not useful for these high temperature ion implants.

Therefore, it would be beneficial if there were a method of selectively implanting a portion of a workpiece at high temperatures. Further, it would be advantageous if this selective implanting did not introduce a significant number of addition processes to the overall semiconductor manufacturing process.

SUMMARY

A method for the selective implantation of a workpiece is disclosed. In place of conventional photoresist, a two layer structure is used. The first layer, referred to as the protective layer, is applied directly to the workpiece and protects the workpiece from harmful etching processes. Additionally, the protective layer has limited ability to stop ions from impacting the workpiece. The second layer, referred to as the blocking layer, which is formed on a portion of the protective layer, is used to block ions from impacting the underlying workpiece. Advantageously, the blocking layer may be selectively etched without affecting the protective layer. Additionally, the protective layer can be removed without affecting the underlying workpiece. Through the use of this two layer technique, high temperature selective implants may be performed on a variety of different semiconductor devices.

According to one embodiment, a method of processing a workpiece is disclosed. The method comprises depositing a protective layer on the workpiece; forming a blocking layer on a portion of the protective layer, less than an entirety of the protective layer; directing ions toward the workpiece after forming the blocking layer; removing the blocking layer after the directing; and removing the protective layer. In certain embodiments, the ions are implanted at an elevated temperature above 150° C. In certain embodiments, the protective layer is a carbon-based film having a thickness of 10 nm or less. In certain embodiments, the blocking layer comprises germanium and the blocking layer is removed using hot deionized water.

According to another embodiment, a method of performing an ion implant is disclosed. The method comprises depositing a carbon-based protective layer on a workpiece; forming a blocking layer on certain portions of the carbon-based protective layer; and directing ions toward the workpiece, wherein ions pass through the carbon-based protective layer and implant the workpiece, but do not pass through the blocking layer. In certain embodiments, the blocking layer comprises a material selected from the group consisting of silicon dioxide, silicon nitride, germanium, amorphous silicon and polysilicon.

According to one embodiment, a method of processing a workpiece is disclosed. The method comprises depositing a carbon-based protective layer on the workpiece; depositing a blocking layer on the carbon-based protective layer; applying photoresist to a portion of the blocking layer; removing a portion of the blocking layer not covered by the photoresist using a dry etch process; removing the photoresist using a hydrogen plasma strip; directing ions toward the workpiece wherein the ions pass through the carbon-based protective layer and implant the workpiece, but do not pass through the blocking layer; removing the blocking layer using the dry etch process after the directing; and removing the carbon-based protective layer from the workpiece using a sulphuric peroxide mixture. In certain embodiments, the blocking layer comprises silicon dioxide or silicon nitride, and the dry etch process uses a $CHF_3/CF_4$ dry etch chemistry. In certain embodiments, the blocking layer comprises silicon nitride, and the dry etch process uses a $SF_6$ dry etch chemistry. In certain embodiments, the blocking layer comprises amorphous silicon or polysilicon, and the dry etch process uses a HBr dry etch chemistry.

BRIEF DESCRIPTION OF THE FIGURES

For a better understanding of the present disclosure, reference is made to the accompanying drawings, which are incorporated herein by reference and in which.

DETAILED DESCRIPTION

As described above, many semiconductor processes utilize ion implantation. Further, recently, the use of high temperature implants has been more commonplace. Due to temperature limits associated with conventional photoresist, new techniques for processing selective implants are being developed.

The present disclosure exploits the use of two different layers to perform the function traditionally done by photoresist. Specifically, the first layer, which is applied directly to the workpiece, is a protective layer. This protective layer is used to protect the underlying workpiece, which may be a silicon wafer or a wafer made of germanium, silicon carbide, a III-V material or a II-VI material, from potentially harmful etching processes. The protective layer also has limited ability to stop ions from impacting the workpiece. The second layer, referred to as the blocking layer, is disposed on top of the protective layer. This blocking layer serves to block ions from impacting the workpiece. Both of these layers are able to withstand the temperatures associated with a high temperature implant, which may be 500° C. or more.

FIGS. 1A-1I show a representative sequence of processes that may be used to selectively implant a workpiece. Throughout these figures, two semiconductor devices are shown as being the target of these patterned implants. However, it is understood that FIGS. 1A-1I represents only one embodiment, and that the disclosed technique may be used for the processing of any semiconductor device.

Figure 1A:
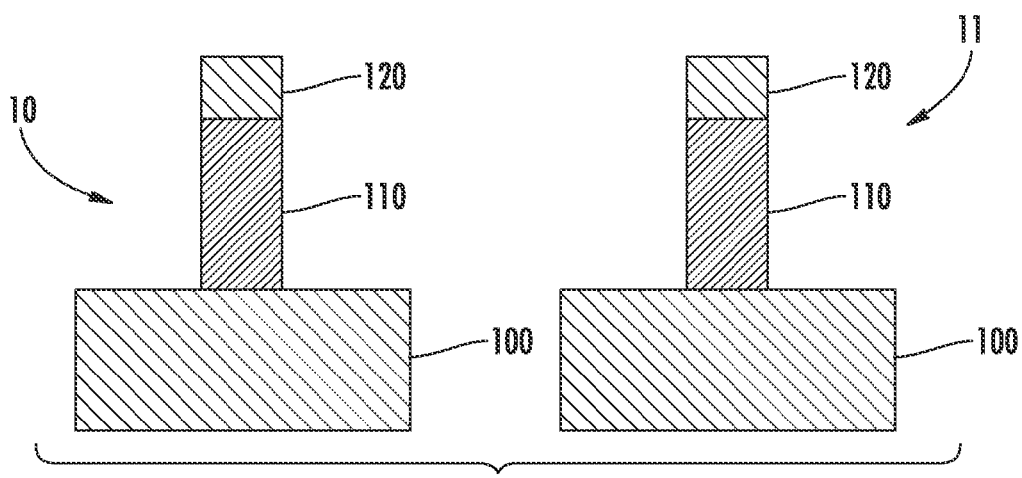
FIGS. 1A-1I show a sequence that performs selective implantation of a portion of a workpiece.

FIG. 1A shows a first semiconductor device, which may be a first finFET 10 and a second semiconductor device, which may be second finFET 11. In this example, a selective implant is to be performed on the first finFET 10, without implanting the second finFET 11. There are no limitations on the selection of the first finFET 10 and the second finFET 11. For example, in one embodiment, the first finFET 10 may represent an n-type finFET while the second finFET 11 may represent a p-type finFET. In another embodiment, the first finFET 10 may be a p-type finFET while the second finFET 11 represents an n-type finFET. In other embodiments, the first finFET 10 and the second finFET 11 may both be n-type devices or may both be p-type devices. For example, in certain embodiments, different processing may be performed on finFETs that are used for memory storage than on finFETs that are used for logic functions. Thus, the choice of the first finFET 10 and the second finFET 11 is not limited by this disclosure. FIGS. 1A-1I illustrates the difference in processing between the first finFET 10 that is to be implanted and the second finFET 11 that is not being implanted. Note that while FIGS. 1A-1I show two semiconductor devices, this technique is applicable for any two different portions of a workpiece.

FIG. 1A shows a first finFET 10 and a second finFET 11 that are disposed on a single workpiece. These finFETs are shown as being identical in structure, each having a fin 100, with a gate 110 disposed thereon. The gate 110 is covered by a cap 120. These finFETs may be disposed adjacent to one another, or may be disposed on different portions of the workpiece. As noted above, the first finFET 10 is to be implanted in this process, while the second finFET 11 is not implanted.

Figure 1B:
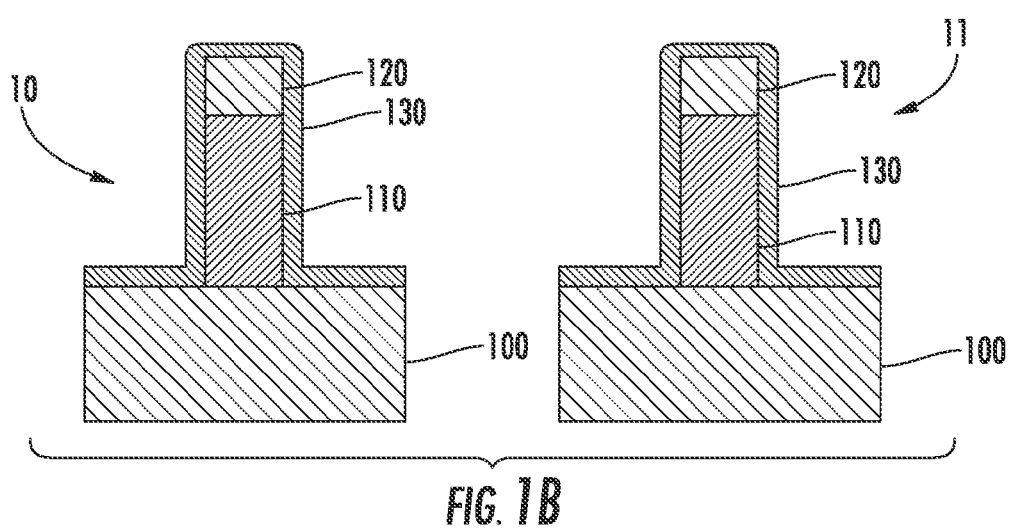

FIG. 1B shows a first process, where a protective layer 130 is deposited on each finFET. In certain embodiments, the protective layer 130 is deposited directly on the underlying semiconductor device or workpiece. The protective layer 130 may be a carbon based film that may have high conformity. Further, the protective layer 130 may be thin, such as less than 10 nm. The protective layer 130 may comprise a material that has high etch selectivity to the underlying workpiece, such that etching processes that remove the protective layer 130 do not affect the underlying workpiece. Further, the material used for the protective layer 130 may tolerate temperatures greater than 500° C. The protective layer 130 may be conformally deposited on the workpiece, such as through the use of a chemical vapor deposition (CVD) system. CVD systems are well known in the art and will not be described herein. In addition to its high selectivity, the protective layer 130 preferably has limited ability to stop ions from impacting the underlying workpiece. In other words, when an ion implant process is performed on a workpiece that has a protective layer 130, most of the ions may reach the workpiece. In certain embodiments, more than 75% of the ions reach the workpiece. In other embodiments, more than 90% of the ions reach the workpiece. Further, the energy of the ions may be minimally affected by collisions with the protective layer 130, such that the ions may reach the desired depths in the underlying workpiece.

Figure 1C:
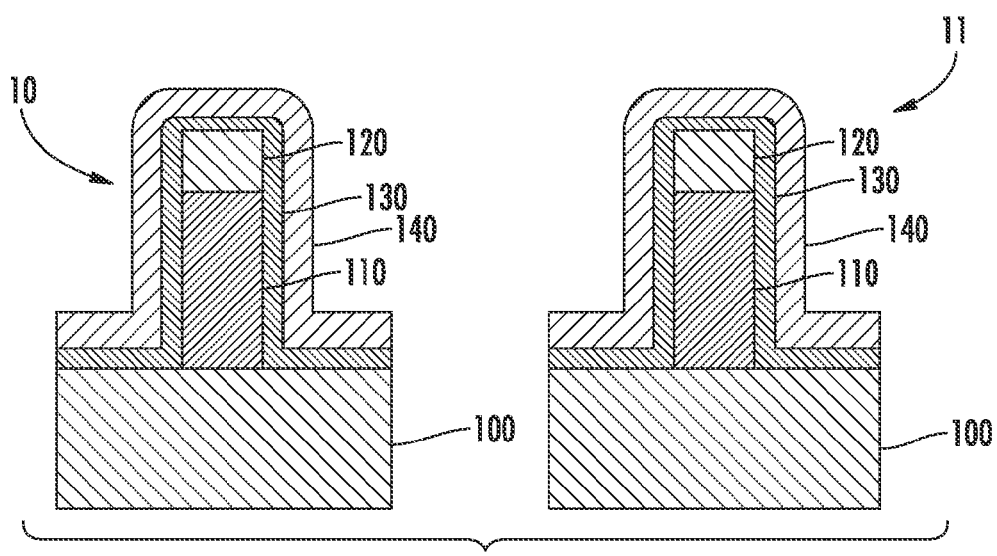

In FIG. 1C, a blocking layer 140 is deposited on the protective layer 130. In certain embodiments, the blocking layer 140 is deposited directly on the protective layer 130. Unlike the protective layer 130, the blocking layer 140 exhibits a great ability to block ions from impacting the workpiece. Further, the blocking layer 140 may be a material that may be removed selectively to the protective layer 130, such that the removal of the blocking layer 140 does not affect the protective layer 130. Further, the material used for the blocking layer 140 may tolerate high temperatures, such as above 500° C. In certain embodiments, the thickness of the blocking layer 140 may be between 10 nm and 30 nm, although other thickness may also be used. The blocking layer 140 may be conformally deposited using a CVD system. Alternatively, the blocking layer 140 may be a planarizing material that is spun on the workpiece. In certain embodiments, the blocking layer 140 may comprise a silicon-based material. Various materials may be used for the blocking layer 140, including silicon dioxide, silicon nitride, polysilicon, amorphous silicon, germanium, amorphous germanium, polysilicon germanium or spun on glass.

Figure 1D:
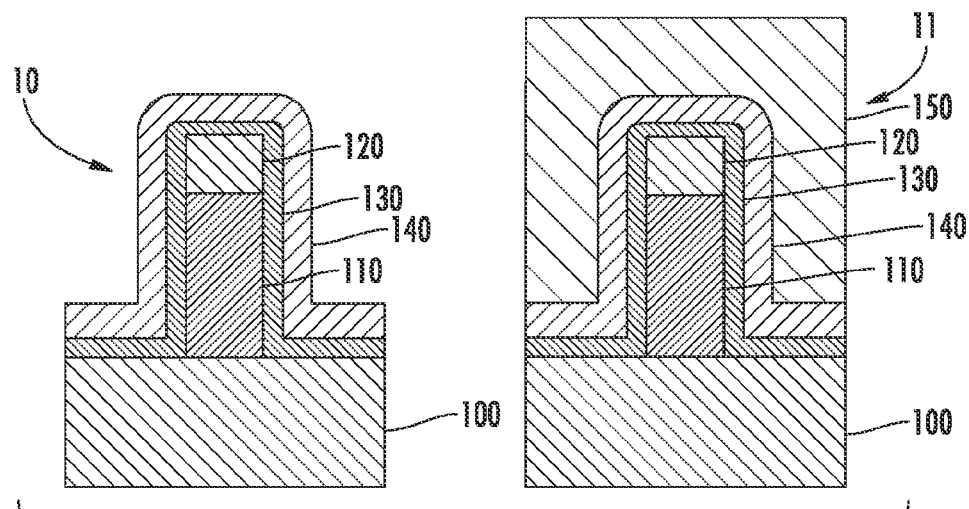

In FIG. 1D, a photoresist 150 is deposited on the second finFET 11, which is not to be implanted. This photoresist 150 may be any traditional photoresist. The photoresist may be applied in any known manner. This process may be performed at room temperature.

Figure 1E:
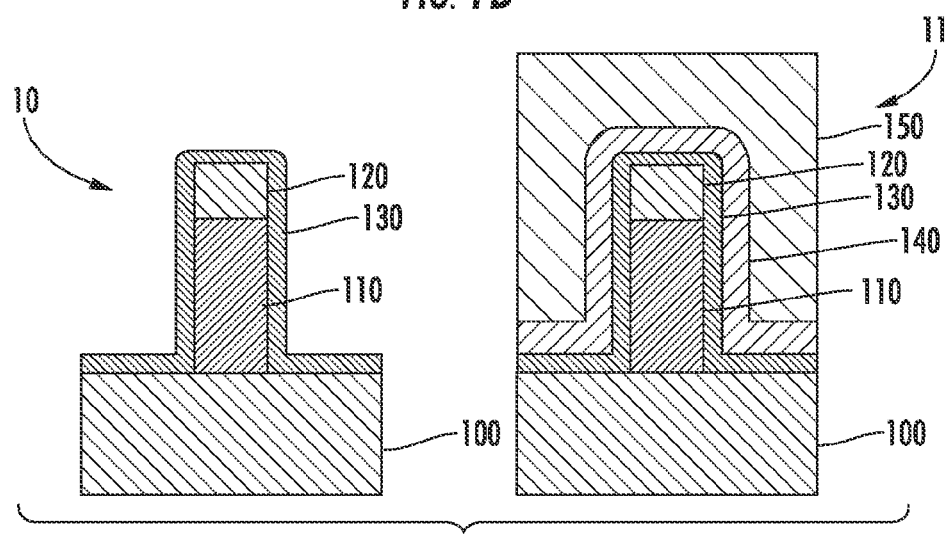

In FIG. 1E, the blocking layer 140 is removed from the first finFET 10, while the photoresist 150 protects the blocking layer 140 on the second finFET 11. The blocking layer 140 may be removed without affecting the protective layer 130. For example, if the blocking layer is comprised of silicon dioxide or silicon nitride, the blocking layer 140 may be removed using a $CHF_3/CF_4$ based dry etch chemistry. Further, if the blocking layer 140 is comprised of silicon nitride ($Si_3N_4$), the blocking layer 140 may be removed using a $SF_6$ dry etch chemistry. If the blocking layer 140 is comprised of amorphous silicon or polysilicon, the blocking layer 140 may be etched with HBr dry etch chemistry. If the blocking layer 140 is comprised of germanium, which also includes amorphous germanium or polysilicon germanium, the blocking layer 140 may be removed using hot deionized water. This list is not intended to be exhaustive; rather, it is intended to show that it is possible to selectively remove the blocking layer 140 without affecting the protective layer 130. Since photoresist is disposed on the workpiece during this process, this process may also be performed at room temperature.

Figure 1F:
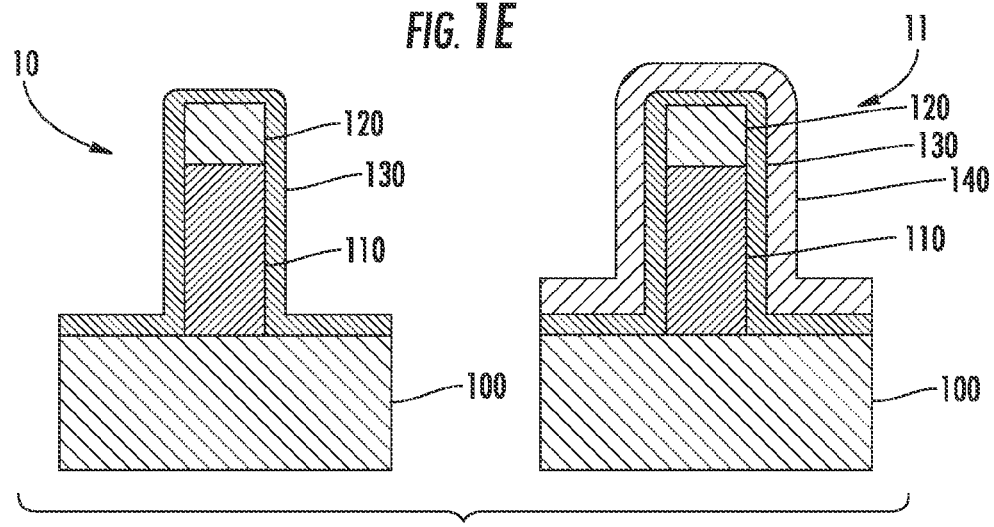

In FIG. 1F, the photoresist 150 is removed from the second finFET 11. The photoresist 150 may be removed using a hydrogen plasma strip. This process may not affect the protective layer 130 on the first finFET 10 or the blocking layer 140 on the second finFET 11. Note that after the photoresist 150 is removed, the second finFET 11 still retains the blocking layer 140 and therefore, will not be implanted by any subsequent ion implants. Since photoresist is disposed on the workpiece during this process, this process may also be performed at room temperature.

Figure 1G:
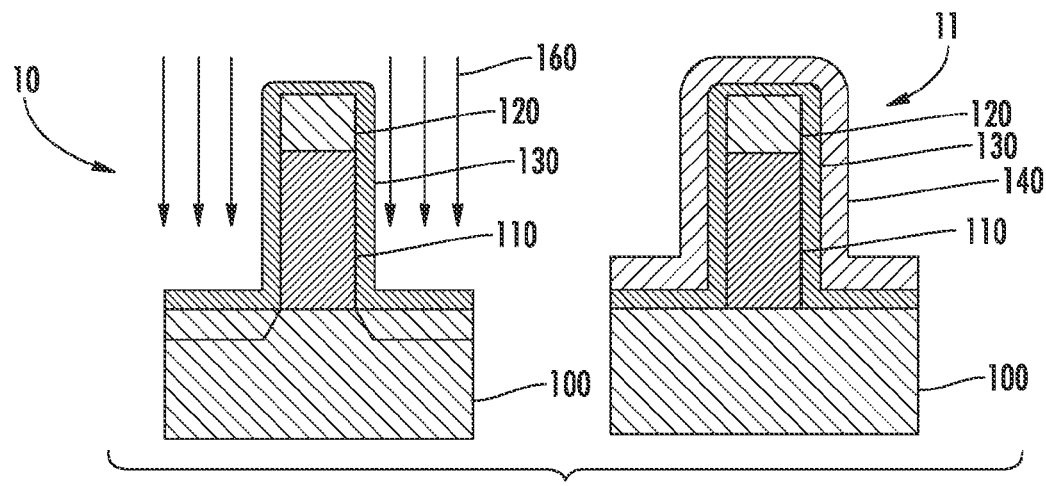

In FIG. 1G, ions 160 are directed toward the workpiece. This ion implantation may be performed at an elevated temperature, such as between 150° C. and 500° C. In certain embodiments, the ion implantation may be performed at elevated temperatures above 500° C. Although ions 160 are only shown proximate first finFET 10, it is understood that the ions 160 may be directed toward the entirety of the workpiece. Because of the inability of the protective layer 130 to block ions, ions 160 penetrate the protective layer 130 and are implanted into the first finFET 10. Meanwhile, the ions 160 are blocked from implanting the second finFET 11 by the presence of the blocking layer 140. Note that there may be a change in temperature between the process where the photoresist 150 is removed and the implanting of ions 160. For example, in certain embodiments, all processes, except the ion implantation shown in FIG. 1G, may be performed at room temperature. In other embodiments, processes that involve the use of photoresist 150 may be performed at room temperature, while the ion implantation is performed at elevated temperatures.

Note that while the first finFET 10 and the second finFET 11 are in the configuration shown in FIG. 1G, multiple implants may be done to first finFET 10, without implanting the second finFET 11.

Figure 1H:
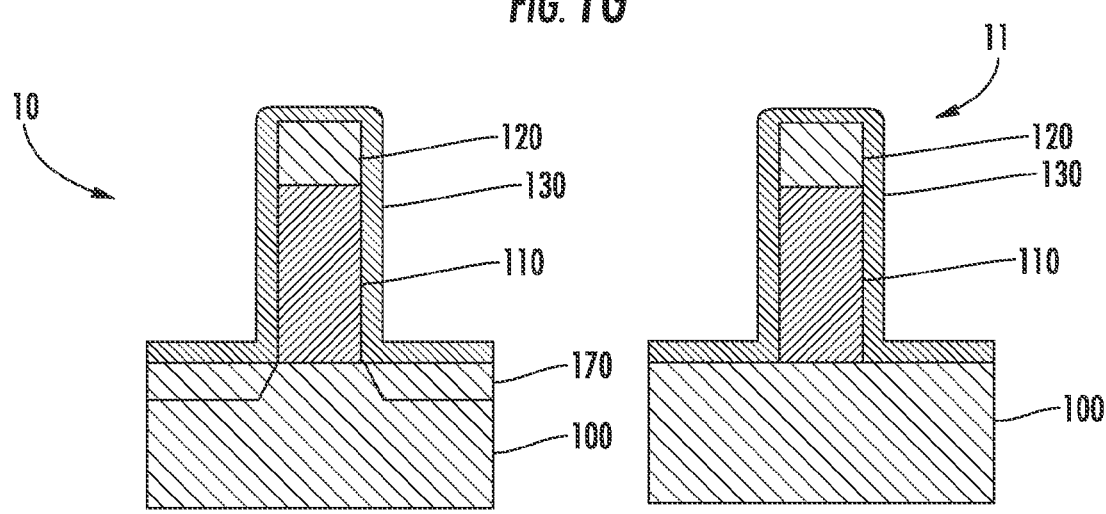

After the ion implantation is completed, doped extensions 170 may be disposed in fin 100 of first finFET 10, as shown in FIG. 1H. At this juncture, the blocking layer 140 may be removed from the second finFET 11, using the technique described in conjunction with FIG. 1E.

Figure 1I:
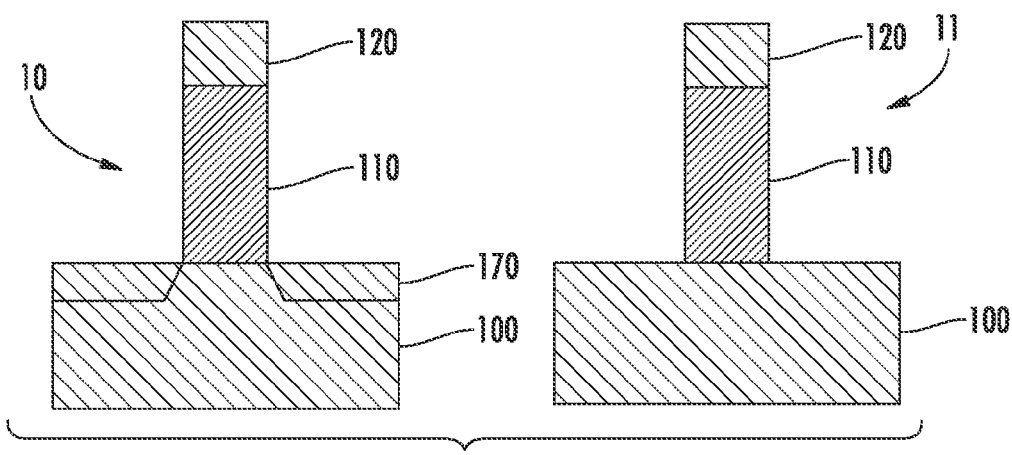

Finally, as shown in FIG. 1I, the protective layer 130 may be removed from the workpiece. In certain embodiments, the protective layer 130 may be removed using a sulphuric peroxide mixture. This mixture may be effective at removing the protective layer 130 without affecting the underlying workpiece.

The sequence illustrated in FIGS. 1A-1I may be repeated a plurality of times on a single workpiece, if desired. For example, additional implants may be used to modify the threshold voltage of certain transistors, to implant the extensions of p-type finFETs, or other functions.

The use of a carbon based film for the protective layer 130 expands the choices of materials that may be used to form the blocking layer 140. For example, between the protective layer 130 is disposed between the blocking layer 140 and the workpiece, the blocking layer 140 may be the same material as the workpiece, and still be selectively etched to the workpiece. Thus, the blocking layer 140 may be silicon-based, while the workpiece may be a silicon wafer.

Further, FIGS. 1C-1E show one method that may be used to create a first finFET 10 that has a protective layer 130 and the second finFET 11 that has both a protective layer 130 and a blocking layer 140. The sequence of FIGS. 1C-1E performs this through the use of subtractive techniques, where the blocking layer is disposed on first finFET 10 and then removed.

The implant of the first finFET 10 may be performed using any suitable ion beam implantation system.

Figure 2:
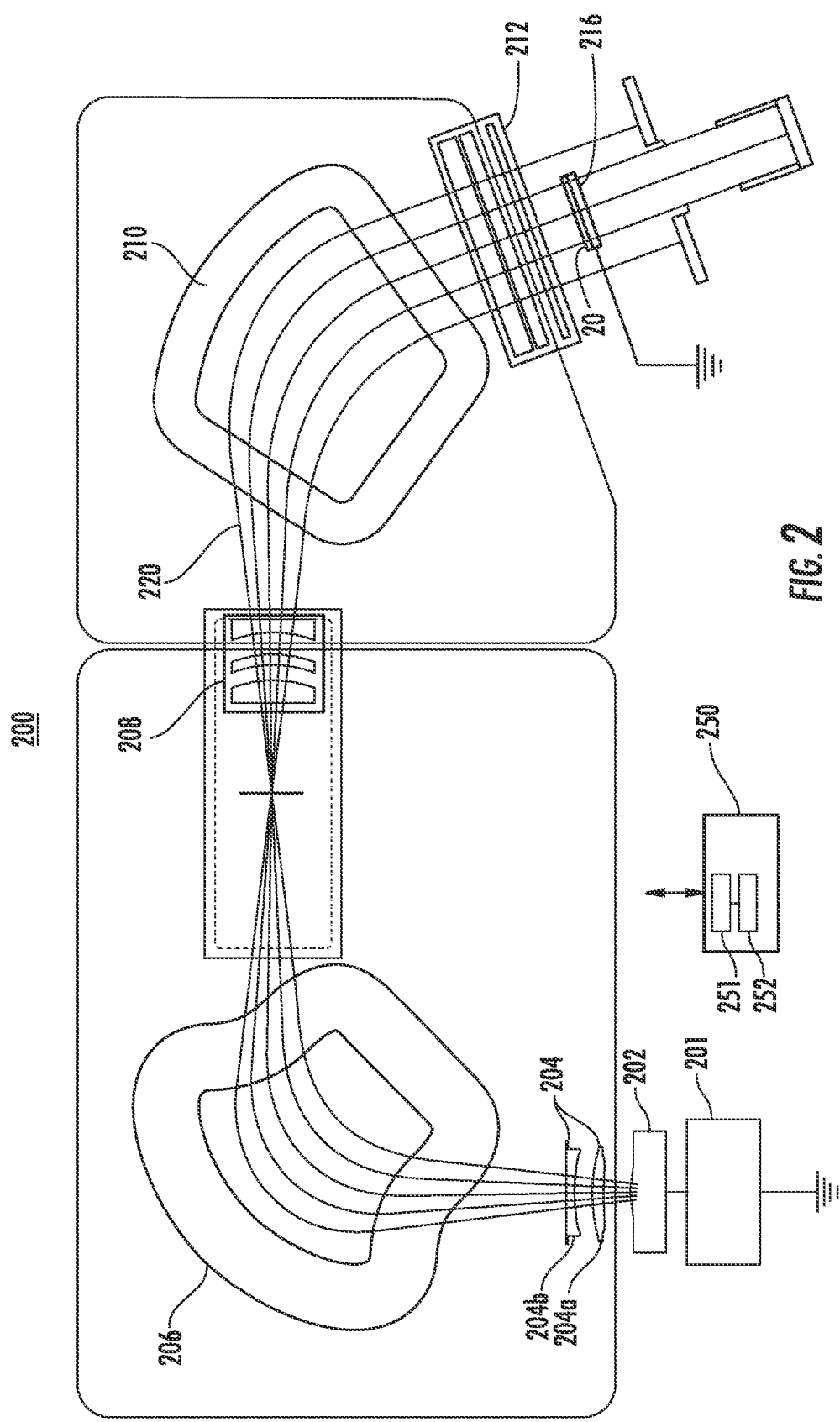
FIG. 2 is an ion implantation system in accordance with one embodiment that may be used to perform the selective implantation of FIGS. 1A-1I.

FIG. 2 shows a beamline ion implantation system 200 that may be used to perform the high temperature ion implantation shown in FIG. 1G. As illustrated in the figure, the beamline ion implantation system 200 may comprise an ion source and a complex series of beam-line components through which an ion beam 220 passes. The ion source may comprise an ion source chamber 202 where ions are generated. The ion source may also comprise a power source 201 and extraction electrodes 204 disposed near the ion source chamber 202. The extraction electrodes 204 may include a suppression electrode 204a and a ground electrode 204b. Each of the ion source chamber 202, the suppression electrode 204a, and the ground electrode 204b may include an aperture. The ion source chamber 202 may include an extraction aperture (not shown), the suppression electrode may include a suppression electrode aperture (not shown), and a ground electrode may include a ground electrode aperture (not shown). The apertures may be in communication with one another so as to allow the ions generated in the ion source chamber 202 may pass through, toward the beam-line components.

The beamline components may include, for example, a mass analyzer 206, a first acceleration or deceleration (A1 or D1) stage 208, a collimator 210, and a second acceleration or deceleration (A2 or D2) stage 212. Much like a series of optical lenses that manipulate a light beam, the beamline components can filter, focus, and manipulate ions or ion beam 220.

The ion beam 220 that passes through the beamline components may be directed toward the workpiece 20 that is mounted on a platen 216 or clamp. The platen 216 may be heated to allow high temperature implants. The workpiece 20 may be moved in one or more dimensions by an apparatus, sometimes referred to as a "roplat."

A controller 250 may be used to control the operation of the beamline ion implantation system 200. The controller 250 may include a processing unit 251 and a storage element 252. The storage element 252 may be any suitable non-transitory memory device, such as semiconductor memory (i.e. RAM, ROM, EEPROM, FLASH RAM, DRAM, etc), magnetic memory (i.e. disk drives), or optical memory (i.e. CD ROMs). The storage element 252 may be used to contain the instructions, which when executed by the processing unit 251 in the controller 250, allow the beamline ion implantation system 200 to perform at least part of the sequence shown in FIGS. 1A-1I.

Figures 3, 4:
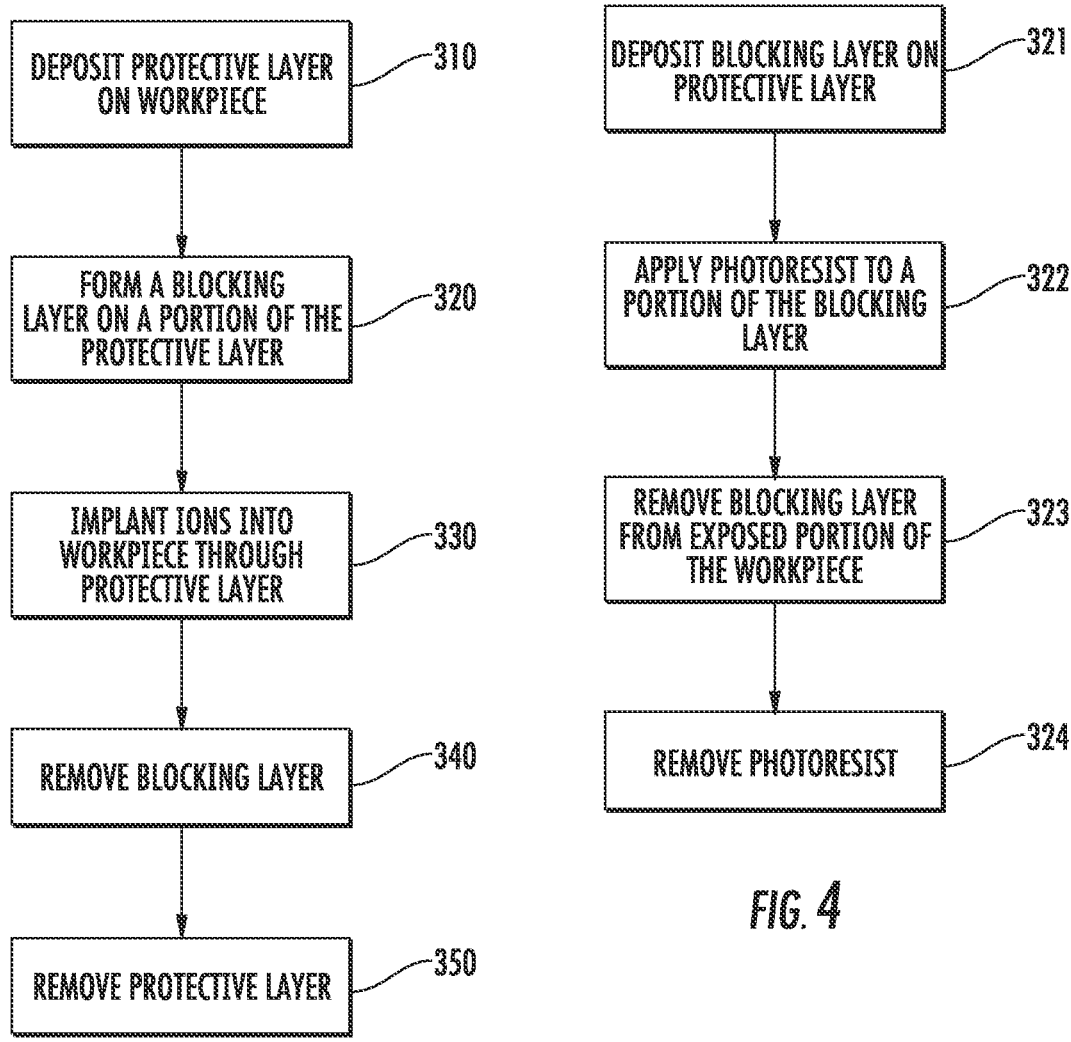
FIG. 3 shows a flowchart that may be used for selective implantation of a portion of a workpiece.
FIG. 4 shows a flowchart that may be used to perform a portion of the sequence shown in FIG. 3.

FIG. 3 shows a flowchart of the sequence illustrated in FIGS. 1A-1I.

First, as shown in Process 310, a protective layer 130 is deposited on the workpiece. As described above, the protective layer 130 may be a carbon-based film, having a thickness of less than 10 nm. This protective layer 130 may be conformally deposited using a CVD system. As described above, the protective layer 130 may have limited ability to stop ions from impacting the workpiece.

After the protective layer 130 is deposited, a blocking layer 140 may be formed on a portion of the protective layer, which is less than the entirety of the protective layer 130, as shown in Process 320. The blocking layer 140 may be selectively etched to the protective layer 130. Further, the blocking layer 140 may have the ability to stop ions from impacting the workpiece, much in the same way that a photoresist functions. In certain embodiments, the blocking layer 140 may be a silicon-based material.

Ions 160 are then directed toward the workpiece and implant the workpiece through the protective layer 130, as shown in Process 330. Note that the ions 160 do not implant the portion of the workpiece that is covered by the protective layer 130 and the blocking layer 140. This ion implantation process may be performed at an elevated temperature, such as 500° C.

Next, the blocking layer 140 may be removed from the protective layer 130, as shown in Process 340. As described above, removal of the blocking layer 140 does not affect the protective layer 130.

Finally, the protective layer 130 may be removed from the workpiece, as shown in Process 350. As described above, removal of the protective layer 130 does not affect the underlying workpiece.

The sequence shown in FIG. 3 may be repeated a plurality of times for a particular workpiece if desired.

In one embodiment, shown in FIG. 4, the formation of the blocking layer 140 on a portion of the protective layer 130 may comprise a plurality of processes.

First, the blocking layer 140 may be disposed on the entirety of the protective layer 130, as shown in Process 321.

A portion of the blocking layer 140 is then removed from a portion of the workpiece. This may be done by depositing photoresist 150 on a portion of the blocking layer 140, as shown in Process 322. After this, an etching process may be used to remove the exposed blocking layer 140 that is not covered by the photoresist 150, as shown in Process 323. The photoresist 150 can then be removed after this etching process, as shown in Process 324. At this point, a portion of the workpiece may be covered by the protective layer 130, while another portion of the workpiece may be covered by both the protective layer 130 and the blocking layer 140.

Of course, there may be other techniques to form a blocking layer 140 on a portion of the protective layer 130.

The embodiments described above in the present application may have many advantages. As described above, certain ion implantation processes achieve better results when performed at elevated temperatures. Traditional photoresist may not be capable of use at these elevated temperatures. Further, the use of a carbon-based protective layer 130 may allow a wider choice of materials that are available for the blocking layer 140. For example, various germanium and silicon-based materials, such as silicon dioxide, silicon nitride, polysilicon, germanium and amorphous silicon may be used as a blocking layer 140, when a carbon-based protective layer 130 is first deposited on the workpiece.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a workpiece, comprising:
depositing a carbon-based protective layer on the workpiece, wherein the carbon-based protective layer is conformally deposited on the workpiece;
forming a blocking layer on a portion of the carbon-based protective layer, less than an entirety of the carbon-based protective layer, wherein the conformally deposited carbon-based protective layer is not affected by and remains intact after the forming of the blocking layer, wherein the forming comprises:
depositing the blocking layer on the carbon-based protective layer;
applying photoresist to a portion of the blocking layer;
removing a portion of the blocking layer not covered by the photoresist without affecting the carbon-based protective layer; and
removing the photoresist from the blocking layer;
directing ions toward the workpiece after forming the blocking layer while the conformally deposited carbon-based protective layer remains intact on the workpiece and after the photoresist has been removed, wherein ions pass through the carbon-based protective layer and implant the workpiece, but do not pass through the blocking layer;
removing the blocking layer after the directing; and
removing the carbon-based protective layer after the directing.

2. The method of claim 1, wherein the ions pass through the carbon-based protective layer and implant the workpiece, but do not pass through the blocking layer.

3. The method of claim 1, wherein the ions are implanted at an elevated temperature above 150° C.

4. The method of claim 1, wherein the carbon-based protective layer comprises a carbon-based film having a thickness of 10 nm or less.

5. The method of claim 1, wherein the blocking layer comprises a material selected from the group consisting of silicon dioxide, silicon nitride, germanium, amorphous silicon and polysilicon.

6. The method of claim 1, wherein the blocking layer is removed without removing the carbon-based protective layer.

7. The method of claim 6, wherein the blocking layer is removed using a dry etch process.

8. The method of claim 6, wherein the blocking layer comprises germanium and the blocking layer is removed using hot deionized water.

9. The method of claim 1, wherein the blocking layer is selectively etched to the carbon-based protective layer.

10. A method of processing a workpiece, comprising:
depositing a carbon-based protective layer on the workpiece, wherein the protective layer is conformally deposited on the workpiece;
depositing a blocking layer on the carbon-based protective layer;
applying photoresist to a portion of the blocking layer;
removing a portion of the blocking layer not covered by the photoresist using a dry etch process, wherein the protective layer is not affected by the removing of the portion of the blocking layer;
removing the photoresist from the blocking layer using a hydrogen plasma strip such that the conformally deposited protective layer remains intact;
directing ions toward the workpiece after removing the photoresist and while the conformally deposited protective layer remains intact on the workpiece, wherein the ions pass through the carbon-based protective layer and implant the workpiece, but do not pass through the blocking layer;
removing the blocking layer using the dry etch process after the directing; and
removing the carbon-based protective layer from the workpiece using a sulphuric peroxide mixture after removing the blocking layer.

11. The method of claim 10, wherein the blocking layer comprises silicon dioxide or silicon nitride, and the dry etch process uses a $CHF_3/CF_4$ dry etch chemistry.

12. The method of claim 10, wherein the blocking layer comprises silicon nitride, and the dry etch process uses a $SF_6$ dry etch chemistry.

13. The method of claim 10, wherein the blocking layer comprises amorphous silicon or polysilicon, and the dry etch process uses a HBr dry etch chemistry.

14. The method of claim 10, wherein the ions are implanted at an elevated temperature above 150° C.

15. The method of claim 10, wherein the carbon-based protective layer is deposited using chemical vapor deposition.

16. The method of claim 10, wherein no photoresist is present on the blocking layer during the directing.

17. The method of claim 1, wherein the carbon-based protective layer is deposited using chemical vapor deposition.

18. The method of claim 1, wherein no photoresist is present on the blocking layer during the directing.

* * * * *